(12) United States Patent
Yorisue

(10) Patent No.: US 8,557,498 B2
(45) Date of Patent: Oct. 15, 2013

(54) PHOTOSENSITIVE RESIN COMPOSITION

(75) Inventor: Tomohiro Yorisue, Tokyo (JP)

(73) Assignee: Asahi Kasei E-Materials Corporation, Tokyo (JP)

( * ) Notice: Subject to any disclaimer, the term of this patent is extended or adjusted under 35 U.S.C. 154(b) by 671 days.

(21) Appl. No.: 12/531,813

(22) PCT Filed: Mar. 25, 2008

(86) PCT No.: PCT/JP2008/055480
§ 371 (c)(1), (2), (4) Date: Sep. 17, 2009

(87) PCT Pub. No.: WO2008/123210
PCT Pub. Date: Oct. 16, 2008

(65) Prior Publication Data
US 2010/0104827 A1    Apr. 29, 2010

(30) Foreign Application Priority Data
Apr. 4, 2007   (JP) ................ 2007-098088

(51) Int. Cl.
G03F 7/029 (2006.01)
G03F 7/038 (2006.01)
G03F 7/20 (2006.01)
G03F 7/30 (2006.01)

(52) U.S. Cl.
USPC .......... 430/270.1; 430/287.1; 430/311; 430/325; 430/330; 430/916; 430/923; 430/925

(58) Field of Classification Search
None
See application file for complete search history.

(56) References Cited

U.S. PATENT DOCUMENTS

| | | |
|---|---|---|
| 5,158,988 A | 10/1992 | Kurita et al. |
| 5,210,110 A | 5/1993 | Rutsch et al. |
| 5,629,358 A | 5/1997 | Nagahata et al. |
| 5,861,235 A | 1/1999 | Harkness et al. |
| 6,627,672 B1 | 9/2003 | Lin et al. |
| 6,984,483 B1 | 1/2006 | Roscher et al. |
| 2004/0202956 A1 * | 10/2004 | Takahashi et al. ......... 430/270.1 |
| 2004/0242830 A1 | 12/2004 | Frohlich et al. |
| 2008/0194856 A1 | 8/2008 | Frohlich et al. |

FOREIGN PATENT DOCUMENTS

| | | |
|---|---|---|
| CA | 2 378 756 A1 | 1/2001 |
| JP | 61-67263 A | 4/1986 |
| JP | 5-202146 A | 8/1993 |
| JP | 10-83080 A | 3/1998 |
| JP | 2006-45316 A | 2/2006 |
| JP | 2008-7642 * | 1/2008 |
| WO | WO 03/031499 A2 | 4/2003 |

OTHER PUBLICATIONS

Machine-assisted English translation of JP2008-7642 provided by JPO (2008).*
Extended European Search Report dated May 20, 2010 for European Application No. 08738789.0.

* cited by examiner

*Primary Examiner* — Sin J. Lee
(74) *Attorney, Agent, or Firm* — Birch, Stewart, Kolasch & Birch, LLP

(57) ABSTRACT

A photosensitive resin composition is used that comprises a photosensitive silicone having a styryl group as a photosensitive group, and a photopolymerization initiator having a specific structure. As a result, a photosensitive resin composition capable of being cured in air by photopolymerization that is preferable for use as a buffer coat material or rewiring layer of an LSI chip, a method for forming a cured relief pattern using this photosensitive resin composition, and a semiconductor device comprising the cured relief pattern are provided.

5 Claims, No Drawings

PHOTOSENSITIVE RESIN COMPOSITION

TECHNICAL FIELD

The present invention relates to a resin insulating film used in semiconductor devices, multilayer wiring boards and optical materials such as microlenses. More particularly, the present invention relates to a photosensitive resin composition for producing a patterned insulating film preferable for a buffer coat material or rewiring layer of an LSI chip, and to a resin insulating film obtained using the same.

BACKGROUND ART

The performance requirements for insulating materials exemplified by buffer coat materials and rewiring layer materials of LSI chips are becoming increasingly severe with respect to the properties of, for example, higher resolution, low-temperature heat treatment, low stress and low dielectric constant accompanying higher performance levels of LSI. In particular, in order to satisfy requirements for lower dielectric constants of interlayer insulating film materials, stress resistance and heat resistance have decreased, and in response to requirements for higher speeds placed on rewiring Cu layers, the Cu used for rewiring has tended to become thicker due to increased current density. Consequently, in addition to requirements for high resolution, chemical resistance and temperature stress resistance, buffer coat materials and rewiring layer materials are also being required to satisfy requirements with respect to thick film formation ability, flatness, low stress, low dielectric constant and low-temperature heat curing treatment.

In the past, photosensitive polyimides, for example, were used as a typical example of an LSI chip buffer coat material. Compositions containing a polyimide precursor, having a photopolymerizable double bond in a side chain thereof, and a photopolymerization initiator were widely used as photosensitive polyimides. These compositions were spin-coated onto an LSI wafer followed by crosslinking the double bonds of the side chain in a photo-crosslinking reaction by irradiating with light through a photomask. Subsequently, a pattern was formed during development and simultaneous to decomposing and volatizing the crosslinked chains by heat curing treatment, a patterned insulating film was formed by forming a polyimide structure. An insulating film composed of a polyimide formed in this manner has superior heat resistance, chemical resistance and mechanical properties.

Problems associated with these photosensitive polyimides include susceptibility to crack formation when forming a thick film due to the large residual stress, low flatness with respect to level differences in the surface of the LSI wafer caused by shrinkage of nearly 40% during heat curing treatment, and inferior mechanical properties due to inadequate formation of the polyimide structure at low heat curing treatment temperatures of 200° C. or lower.

In contrast, a photosensitive silicone compound known as Ormocer One manufactured by Fraunhofer ISC of Germany is disclosed in Patent Document 1 that is obtained by condensing a trialkoxysilane having a photopolymerizable functional group and a diaryl silanediol. A composition of this compound and a photopolymerization initiator enables the formation of a negative pattern by irradiating with light, the pattern can be heat-cured at a low temperature of 150° C., and the insulating film after curing has heat resistance equivalent to that of polyimides on the order of 300° C. or higher. On the other hand, as is exemplified by properties such as low residual stress of 10 MPa or less, the absence of shrinkage caused by heat curing treatment, and film thickness loss of within 3% before and after heat curing, it has superior properties that cannot be achieved with polyimides.

Patent Document 1 discloses (meth)acryloxy groups and styryl groups as examples of photopolymerizable functional groups possessed by the photosensitive silicone compound.

In addition, Patent Document 2 discloses a photopolymerizable or thermal polymerizable silicone resin in the form of a photosensitive silicone compound obtained by reacting vinyl phenyl methyl diethoxysilane having a styryl group and diisobutyl silanediol.

Patent Document 1: Canadian Patent No. 2378756

Patent Document 2: US Patent Application No. 2004/0242830

DISCLOSURE OF THE INVENTION

Problems to be Solved by the Invention

The inventors of the present invention investigated photosensitive silicon compounds having a styryl group as a photopolymerizable functional group in order to obtain a cured film having a higher refractive index. However, in the case of a combination of a photosensitive silicone compound having a styryl group and a photopolymerization initiator as described in the aforementioned Patent Document 1 or 2, the photopolymerization reaction does not proceed adequately in an air atmosphere, and only films having an extremely low residual film rate were able to be obtained.

An object of the present invention is to provide a photosensitive resin composition that allows the formation of a photocurable film by irradiating with light in an air atmosphere composed of a photosensitive silicone compound having a styryl group as a photopolymerizable functional group and a photopolymerization initiator.

Means for Solving the Problems

The inventors of the present invention found that the combination of a photosensitive silicon compound having a styryl group as a photosensitive group and a photopolymerization initiator having a phosphine oxide group is effective for solving the aforementioned problems, thereby leading to completion of the present invention. Namely, the present invention is as described below.

1. A photosensitive resin composition, comprising: (A) 100 parts by weight of a photosensitive silicone compound described in (I) below, and (B) 0.1 to 20 parts by weight of a photopolymerization initiator described in (II) below.

(I) Photosensitive silicon compound obtained by adding to at least one type of silanol compound represented by the following formula (a) (to be referred to as component (a)), a component (b) in the form of at least one type of compound selected from the group consisting of compounds represented by the following general formulas (b1), (b2), (b3) and (b4) (to be referred to as components (b1), (b2), (b3) and (b4)) containing the component (b1) at 10 to 100% in terms of the number of moles thereof, at a ratio of component (a) to component (b) of 40/60 mol % to 60/40 mol %, followed by condensing using a catalyst without aggressively adding water.

Here, the number of moles of component (b)=(number of moles of component (b1)+the number of moles of component (b2))+(3/2×number of moles of component (b3))+(2×number of moles of component (b4)).

$$R^1{}_2Si(OH)_2 \qquad (a)$$

($R^1$ represents at least one type of group selected from the group consisting of a $C_1$-$C_{12}$ linear alkyl group, $C_3$-$C_{12}$ branched alkyl group, $C_3$-$C_{12}$ cyclic alkyl group, $C_6$-$C_{12}$ aryl group, $C_7$-$C_{12}$ alkylaryl group and $C_7$-$C_{12}$ arylalkyl group. $R^1$ may be the same or different.)

$$R^2_a R^3_b SiX_{4-a-b} \quad (b1)$$

($R^2$ represents a substituent represented by the following formula (1) or (2), $R^3$ represents a $C_1$-$C_{12}$ hydrocarbon group, X represents a $C_1$-$C_{12}$ alkyl group, a represents an integer selected from 1 and 2, b represents an integer selected from 0 and 1, and a+b does not exceed 2. In the case a is 2, $R^2$ may be the same or different.)

[Chemical 1]

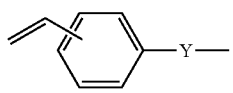

(1)

(Y represents a $C_1$-$C_{12}$ hydrocarbon group or a $C_1$-$C_{12}$ hydrocarbon group containing one or more types of elements selected from the group consisting of oxygen, nitrogen, fluorine and sulfur.)

[Chemical 2]

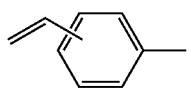

(2)

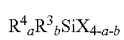

(b2)

($R^4$ represents one type of group selected from the group consisting of a linear $C_1$-$C_{12}$ alkyl group, $C_3$-$C_{12}$ branched alkyl group, $C_3$-$C_{12}$ cyclic alkyl group, $C_6$-$C_{12}$ aryl group, $C_7$-$C_{12}$ alkylaryl group, $C_7$-$C_{12}$ arylalkyl group, $C_2$-$C_7$ epoxy group or unsaturated double bond-containing hydrocarbon group, $C_1$-$C_{12}$ amino group-, ureido group- or mercapto group-containing hydrocarbon group, and $C_1$-$C_{12}$ fluorine-containing hydrocarbon group, $R^3$ represents a $C_1$-$C_{12}$ hydrocarbon group, X represents a $C_1$-$C_{12}$ alkoxy group, a represents an integer selected from 1 and 2, b represents an integer selected from 0 and 1, and a+b does not exceed 2. In the case a is 2, $R^4$ may be the same or different.)

$$M^1 X_3 \quad (b3)$$

($M^1$ represents boron or aluminum, and X represents a $C_1$-$C_{12}$ alkoxy group.)

$$M^2 X_4 \quad (b4)$$

($M^2$ represents silicon, germanium, titanium or zirconium, and X represents a $C_1$-$C_{12}$ alkoxy group.)

(II) At least one type of photopolymerization initiator having a phosphine oxide group represented by the following formula (e).

[Chemical 3]

(e)

(m represents an integer selected from 1 and 2, $R^5$ and $R^6$ respectively and independently represent one type of group selected from the group consisting of a $C_1$-$C_{12}$ alkyl group, $C_6$-$C_{12}$ aryl group, $C_7$-$C_{12}$ alkylaryl group and $C_1$-$C_3$ alkoxy or halogen-substituted aryl group. In the case of a plurality of $R^5$ and $R^6$, $R^5$ and $R^6$ may be the same or different.)

2. The photosensitive resin composition described in 1 above, wherein the catalyst used to obtain the photosensitive silicone compound of (A) is one or more types selected from the group consisting of an acidic compound, a basic compound and a fluoride.

3. A method for forming a cured relief pattern comprising: a step for obtaining a coated film by coating the photosensitive resin composition described in any of 1 or 2 above onto a base material, a step for photocuring an exposed portion by radiating active light onto the coated film, a step for removing an uncured portion of the film using a developing solution, and a step for heating the photocured film, in that order.

4. A cured relief pattern obtained according to the method described in 3 above.

5. A semiconductor device containing the cured relief pattern described in 4 above.

Effects of the Invention

The composition of the present invention allows heat curing treatment at low temperatures, and demonstrates the effect of enabling photopolymerization curing in air even if using a styryl group as a photopolymerizable functional group.

BEST MODE FOR CARRYING OUT THE INVENTION

The following provides a detailed explanation of the present invention.

The photosensitive resin composition of the present invention is characterized by comprising: (A) 100 parts by weight of a photosensitive silicone compound described in (I) below, and (B) 0.1 to 20 parts by weight of a photopolymerization initiator described in (II) below.

(I) Photosensitive silicon compound obtained by adding to at least one type of silanol compound represented by the following formula (a) (to be referred to as component (a)), a component (b) in the form of at least one type of compound selected from the group consisting of compounds represented by the following general formulas (b1), (b2), (b3) and (b4) (to be referred to as components (b1), (b2), (b3) and (b4)) containing the component (b1) at 10 to 100% in terms of the number of moles, at a ratio of component (a) to component (b) of 40/60 mol % to 60/40 mol %, followed by condensing using a catalyst without aggressively adding water.

Here, the number of moles of component (b)=(number of moles of component (b1)+the number of moles of component (b2))+(3/2×number of moles of component (b3))+(2×number of moles of component (b4)).

$$R^1_2 Si(OH)_2 \quad (a)$$

($R^1$ represents at least one type of group selected from the group consisting of $C_1$-$C_{12}$ linear alkyl groups, $C_3$-$C_{12}$ branched alkyl groups, $C_3$-$C_{12}$ cyclic alkyl groups, $C_6$-$C_{12}$ aryl groups, $C_7$-$C_{12}$ alkylaryl groups and $C_7$-$C_{12}$ arylalkyl groups. $R^1$ may be the same or different.)

$$R^2_a R^3_b SiX_{4-a-b} \quad (b1)$$

($R^2$ represents a substituent represented by the following formula (1) or (2), $R^3$ represents a $C_1$-$C_{12}$ hydrocarbon group, X represents a $C_1$-$C_{12}$ alkyl group, a represents an integer selected from 1 and 2, b represents an integer selected from 0 and 1, and a+b does not exceed 2. In the case a is 2, $R^2$ may be the same or different.)

[Chemical 4]

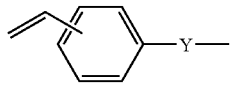
(1)

(Y represents a $C_1$-$C_{12}$ hydrocarbon group or a $C_1$-$C_{12}$ hydrocarbon group containing one or more types of elements selected from the group consisting of oxygen, nitrogen, fluorine and sulfur.)

[Chemical 5]

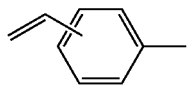
(2)

$R^4{}_aR^3{}_bSiX_{4-a-b}$ (b2)

($R^4$ represents one type of group selected from the group consisting of a linear $C_1$-$C_{12}$ alkyl group, $C_3$-$C_{12}$ branched alkyl group, $C_3$-$C_{12}$ cyclic alkyl group, $C_6$-$C_{12}$ aryl group, $C_7$-$C_{12}$ alkylaryl group, $C_7$-$C_{12}$ arylalkyl group, $C_2$-$C_7$ epoxy group or unsaturated double bond-containing hydrocarbon group, $C_1$-$C_{12}$ amino group-, ureido group- or mercapto group-containing hydrocarbon group, and $C_1$-$C_{12}$ fluorine-containing hydrocarbon group, $R^3$ represents a $C_1$-$C_{12}$ hydrocarbon group, X represents a $C_1$-$C_{12}$ alkoxy group, a represents an integer selected from 1 and 2, b represents an integer selected from 0 and 1, and a+b does not exceed 2. In the case a is 2, $R^4$ may be the same or different.)

$M^1X_3$ (b3)

($M^1$ represents boron or aluminum, and X represents a $C_1$-$C_{12}$ alkoxy group.)

$M^2X_4$ (b4)

($M^2$ represents silicon, germanium, titanium or zirconium, and X represents a $C_1$-$C_{12}$ alkoxy group.)

(II) At least one type of photopolymerization initiator having a phosphine oxide group represented by the following formula (e).

[Chemical 6]

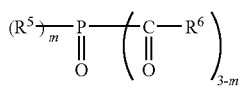
(e)

(m represents an integer selected from 1 and 2, $R^5$ and $R^6$ respectively and independently represent one type of group selected from the group consisting of a $C_1$-$C_{12}$ alkyl group, $C_6$-$C_{12}$ aryl group, $C_7$-$C_{12}$ alkylaryl group and $C_1$-$C_3$ alkoxy or halogen-substituted aryl group. In the case of a plurality of $R^5$ and $R^6$, $R^5$ and $R^6$ may be the same or different.)

In the aforementioned silanol compound of component (a), $R^1$ is one type of group selected from the group consisting of a $C_1$-$C_{12}$ linear alkyl group, $C_3$-$C_{12}$ branched alkyl group, $C_3$-$C_{12}$ cyclic alkyl group, $C_6$-$C_{12}$ aryl group, $C_7$-$C_{12}$ alkylaryl group and $C_7$-$C_{12}$ arylalkyl group. Among these, a $C_6$-$C_{12}$ aryl group is preferable in terms of yielding a higher refractive index of the cured product.

An alkylaryl group refers to an aryl group having an alkyl group, while an arylalkyl group refers to an alkyl group having an aryl group. $R^1$ may be the same or different. Specific examples of substituents that can be used for $R^1$ include an isopropyl group, isobutyl group, cyclohexyl group, phenyl group, tolyl group, xylyl group, trimethylphenyl group and naphthyl group. Those groups that can be used preferably include $C_3$ or larger branched alkyl groups, $C_5$ or larger cyclic alkyl groups and phenyl groups, with a phenyl group being most preferable. Preferable examples of compounds that can be used for the silanol compound of component (a) include diphenyl silanediol, diisopropyl silanediol, diisobutyl silanediol and dicyclohexyl silanediol.

Component (b) is at least one type of compound selected from the group consisting of components (b1), (b2), (b3) and (b4), and contains 10 to 100% of component (b1) in terms of the number of moles thereof.

Component (b1) is an alkoxysilane compound having a styryl group as a photosensitive group. Preferable examples of substituents that can be used for $R^2$ include a styryl group, 1-styryl methyl group and 1-styryl ethyl group. Preferable examples of substituents that can be used for $R^3$ include a methyl group and ethyl group. Preferable examples of substituents that can be used for X include a methoxy group and ethoxy group. Preferable examples of compounds that can be used for component (b1) include styryl trimethoxysilane, styryl triethoxysilane, styryl methyldimethoxysilane, styryl methyldiethoxysilane, 1-styryl methyltrimethoxysilane, 1-styryl methyltriethoxysilane, 1-styryl ethyltrimethoxysilane and 1-styryl ethyltriethoxysilane.

Component (b2) is a dialkoxysilane compound or a trialkoxysilane compound. Preferable examples of substituents that can be used for $R^3$ include a methyl group and ethyl group. Preferable examples of substituents that can be used for $R^4$ include an alkyl group, such as a methyl group, ethyl group, n-propyl group, isopropyl group, n-butyl group, isobutyl group, n-hexyl group or n-decyl group, a cyclic alkyl group such as a cyclopentyl group or cyclohexyl group, an aryl group such as a phenyl group, tolyl group or naphthyl group, an epoxy group-containing group such as a 3-glycidoxy group or 2-(3,4-epoxycyclohexyl)ethyl group, an unsaturated double bond-containing group such as a vinyl group, allyl group, 3-methacryloxypropyl group or 3-acryloxypropyl group, an amino group-containing group such as a 3-aminopropyl group, 3-(2-aminoethyl)aminopropyl group or 3-phenylaminopropyl group, a ureido group-containing group such as a 3-ureidopropyl group, a mercapto group-containing group such as a 3-mercaptopropyl group, and a fluorine containing-hydrocarbon group such as a trifluoropropyl group or tridecafluoro-1,1,2,2-tetrahydrooctyl group. Preferable examples of substituents that can be used for X include a methoxy group and ethoxy group.

Preferable examples of compounds that can be used for component (b2) include methyl trimethoxysilane, dimethyl dimethoxysilane, methyl triethoxysilane, ethyl trimethoxysilane, diisopropyl dimethoxysilane, diisobutyl dimethoxysilane, n-octyl trimethoxysilane, n-decyl trimethoxysilane, dicyclopentyl dimethoxysilane, dicyclopentyl diethoxysilane, phenyl trimethoxysilane, diphenyl dimethoxysilane, 3-glycidoxy trimethoxysilane, 3-glycidoxy triethoxysilane, 2-(3,4-epoxycyclohexyl)ethyl trimethoxysilane, vinyl trimethoxysilane, vinyl triethoxysilane, 3-methacryloxypropyl trimethoxysilane, 3-acryloxypropyl trimethoxysilane, 3-aminopropyl trimethoxysilane, 3-(2-aminoethyl)aminopropyl trimethoxysilane, 3-phenylaminopropyl trimethoxysilane, 3-ureidopropyl triethoxysilane, 3-mercaptopropyl trimethoxysilane, trifluoropropyl trimethoxysilane and tridecafluoro-1,1,2,2-tetrahydrooctyl trimethoxysilane.

Component (b3) is trialkoxy aluminum or trialkoxy boron. Preferable examples of substituents that can be used for X include a methoxy group, ethoxy group, n-propoxy group, isopropoxy group, n-butoxy group, isobutoxy group, sec-butoxy group and tert-butoxy group. Preferable examples of compounds that can be used for component (b3) include trimethoxy aluminum, triethoxy aluminum, tri-n-propoxy aluminum, triisopropoxy aluminum, tri-n-butoxy aluminum, triisobutoxy aluminum, tri-sec-butoxy aluminum, tri-tert-butoxy aluminum, trimethoxy boron, triethoxy boron, tri-n-propoxy boron, triisopropoxy boron, tri-n-butoxy boron, triisobutoxy boron, tri-sec-butoxy boron and tri-tert-butoxy boron.

Component (b4) is a tetraalkoxy silane, tetraalkoxy germanium, tetraalkoxy titanium or tetraalkoxy zirconium. Preferable examples of substituents that can be used for X include a methoxy group, ethoxy group, n-propoxy group, isopropoxy group, n-butoxy group, isobutoxy group, sec-butoxy group and tert-butoxy group.

The aforementioned photosensitive silicone compound of (A) is a photosensitive silicone compound having a styryl group as a photosensitive group obtained by adding to a silanol compound of the aforementioned component (a) the aforementioned component (b), which is at least one type of compound selected from the group consisting of the aforementioned components (b1), (b2), (b3) and (b4) and which contains 10 to 100%, more preferably 50 to 100% and even more preferably 80 to 100% of the component (b1) in terms of the number of moles thereof, at a ratio of (a)/(b) of 40/60 mol % to 60/40 mol %, followed by condensing using a catalyst without aggressively adding water.

Here, the number of moles of component (b)=(number of moles of component (b1)+the number of moles of component (b2))+(3/2×number of moles of component (b3))+(2×number of moles of component (b4)).

Component (b3) has three alkoxy (functional) groups, and component (b4) has four alkoxy (functional) groups. In addition, although there are cases in which components (b1) and (b2) have two or three alkoxy groups, even in the case of having three alkoxy groups, since only two alkoxy groups contribute to the reaction, components (b1) and (b2) are based on having two functional groups. Thus, the coefficients are applied in the manner of the above formula.

The ratio of component (a)/component (b) is preferably 40/60 mol % to 60/40 mol %, preferably 45/55 mol % to 55/45 mol %, more preferably 48/52 mol % to 52/48 mol %, and most preferably 50/50 mol %. The condensation temperature is 50 to 150° C. and preferably 70 to 120° C. During condensation, alcohol formed following heating and refluxing is distilled off under reduced pressure.

Examples of catalysts that can be used include acidic compounds such as $Ti(OR^7)_4$, $Zr(OR^7)_4$, $B(OR^7)_3$ or $Al(OR^7)_3$, basic compounds such as alkaline earth metal hydroxides, and fluorides such as $NH_4F$ or $NR^7_4F$ (wherein, $R^7$ represents one or more groups selected from the group consisting of $C_1$-$C_{12}$ linear hydrocarbon groups, $C_3$-$C_{12}$ branched alkyl groups and $C_3$-$C_{12}$ cyclic alkyl groups).

More specifically, examples of acidic compounds include trimethoxy aluminum, triethoxy aluminum, tri-n-propoxy aluminum, triisopropoxy aluminum, tri-n-butoxy aluminum, triisobutoxy aluminum, tri-sec-butoxy aluminum, tri-tert-butoxy aluminum, trimethoxy boron, triethoxy boron, tri-n-propoxy boron, triisopropoxy boron, tri-n-butoxy boron, triisobutoxy boron, tri-sec-butoxy boron, tetramethoxy titanium, tetraethoxy titanium, tetra-n-propoxy titanium, tetraisopropoxy titanium, tetra-n-butoxy titanium, tetraisobutoxy titanium, tetra-sec-butoxy titanium, tetra-tert-butoxy titanium, tetramethoxy zirconium, tetraethoxy zirconium, tetra-n-propoxy zirconium, tetraisopropoxy zirconium, tetra-n-butoxy zirconium, tetraisobutoxy zirconium, tetra-sec-butoxy zirconium and tetra-tert-butoxy zirconium.

Examples of basic compounds include barium hydroxide, sodium hydroxide, potassium hydroxide, strontium hydroxide, calcium hydroxide, magnesium hydroxide, ammonium hydroxide, tetramethyl ammonium hydroxide, tetrabutyl ammonium hydroxide and triethylamine.

Examples of fluorides include ammonium fluoride, tetramethyl ammonium fluoride and tetrabutyl ammonium fluoride.

Among these catalysts, at least one type selected from the group consisting of tetraisopropoxy titanium (titanium isopropoxide), barium hydroxide, strontium hydroxide, calcium hydroxide and magnesium hydroxide is used preferably.

The amount of catalyst used is 0.01 to 10% by weight and preferably 0.1 to 5% by weight based on the total weight of the silanol compound of component (a) and the component (b). From the viewpoint of progression of the reaction, the amount of catalyst used is 0.01% by weight or more. From the viewpoint of the mechanical characteristics of the cured film the amount of catalyst is 10% by weight or less. Furthermore, component (b3) in the form of trialkoxy aluminum or trialkoxy boron, and component (b4) in the form of tetraalkoxy titanium or tetraalkoxy zirconium also function as catalysts.

Here, in the case the component (a) is diphenyl silanediol and the component (b) consists only of styryl trimethoxysilane of component (b1), for example, the structure of the condensate formed is linear in the manner of the following formula (i).

[Chemical 7]

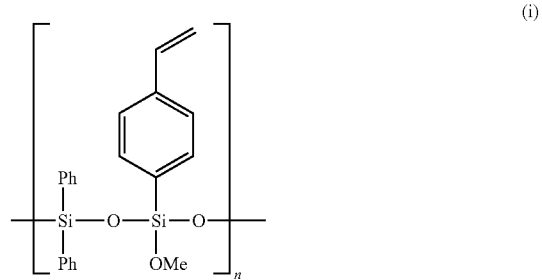

(i)

(B) The following provides an explanation of at least one type of photopolymerization initiator having a phosphine oxide group represented by the following formula (e):

[Chemical 8]

(e)

(wherein, m represents an integer selected from 1 and 2, $R^5$ and $R^6$ respectively and independently represent one type of group selected from the group consisting of a $C_1$-$C_{12}$ alkyl group, $C_6$-$C_{12}$ aryl group, $C_7$-$C_{12}$ alkylaryl group and $C_1$-$C_3$ alkoxy or halogen-substituted aryl group, and in the case of a plurality of $R^5$ and $R^6$, $R^5$ and $R^6$ may be the same or different).

Although any photopolymerization initiator having a phosphine oxide group represented by formula (e) above can be used for the photopolymerization initiator of (B), specific examples include bis(2,4,6-trimethylbenzoyl)phenyl phosphine oxide (trade name: Irgacure 819), bis(2,6-dimethoxybenzoyl)-2,4,4-trimethylpentyl phosphine oxide (trade name: CGI403), and 2,4,6-trimethylbenzoyldiphenyl phosphine oxide (trade name: Darocure TPO). The amount of these photopolymerization initiators added is 0.1 to 20 parts by weight, preferably 0.2 to 10 parts by weight and more preferably 0.2 to 5 parts by weight based on the aforementioned photosensitive silicone of (A). The amount added is 0.1 parts by weight or more from the viewpoint of sensitivity, and 20 parts by weight or less from the viewpoint of mechanical properties.

Furthermore, a photopolymerization initiator other than the aforementioned (B) can be added within a range that does not exceed 10% by weight of (B) for use as a photopolymerization initiator.

Examples of photopolymerization initiators other than (B) include the compounds indicated below:

(1) benzophenone derivatives such as benzophenone, methyl o-benzoylbenzoate, 4-benzoyl-4'-methyl phenyl ketone, dibenzyl ketone or fluorolenone;

(2) acetophenone derivatives such as 2,2'-diethoxyacetophenone, 2-hydroxy-2-methylpropiophenone, 2,2-dimethoxy-1,2-diphenylethan-1-one (Irgacure 651, Ciba Specialty Chemicals Inc.), 1-hydroxycyclohexyl phenyl ketone (Irgacure 184, Ciba Specialty Chemicals Inc.), 2-methyl-1-[4-(methylthio)phenyl]-2-morpholinopropan-1-one (Irgacure 907, Ciba Specialty Chemicals Inc.), 2-hydroxy-1-{4-[4-(2-hydroxy-2-methylpropionyl)-benzyl]-phenyl}-2-methylpropan-1-one (Irgacure 127, Ciba Specialty Chemicals Inc.) or methyl phenylglyoxylate;

(3) thioxanthone derivatives such as thioxanthone, 2-methylthioxanthone, 2-isopropylthioxanthone or diethylthioxanthone;

(4) benzyl derivatives such as benzyl, benzyl dimethyl ketal or benzyl-β-methoxyethyl acetal;

(5) benzoin derivatives such as benzoin, benzoin methyl ether, 2-hydroxy-2-methyl-1-phenylpropan-1-one (Darocure 1173, Ciba Specialty Chemicals Inc.);

(6) oxime-based compounds such as 1-phenyl-1,2-butanedion-2-(O-methoxycarbonyl)oxime, 1-phenyl-1,2-propandione-2-(O-methoxycarbonyl)oxime, 1-phenyl-1,2-propandione-2-(O-ethoxycarbonyl)oxime, 1-phenyl-1,2-propanedione-2-(O-benzoyl)oxime, 1,3-diphenylpropanetrione-2-(O-ethoxycarbonyl)oxime, 1-phenyl-3-ethoxypropanedion-2-(O-benzoyl)oxime, 1,2-octandione, 1-[4-(phenylthio)-2-(O-benzoyloxime)] (Irgacure OXE01, Ciba Specialty Chemicals Inc.), 1-[9-ethyl-6-(2-methylbenzoyl)-9H-carbazol-3-yl]-1-(O-acetyloxime) (Irgacure OXE02, Ciba Specialty Chemicals Inc.);

(7) α-hydroxy ketone-based compounds such as 2-hydroxy-2-methyl-1-phenylpropan-1-one, 1-[4-(2-hydroxyethoxy)phenyl]-2-hydroxy-2-methyl-1-propan-1-one, or 2-hydroxy-1-{4-[4-(2-hydroxy-2-methylpropionyl)-benzyl]phenyl}-2-methylpropane;

(8) α-aminoalkylphenone-based compounds such as 2-benzyl-2-dimethylamino-1-(4-morpholinophenyl)-butanone-1 (Irgacure 369, Ciba Specialty Chemicals Inc.), or 2-dimethylamino-2-(4-methylbenzyl)-1-(4-morpholin-4-yl-phenyl)butan-1-one (Irgacure 379, Ciba Specialty Chemicals Inc.);

(9) phosphine oxide-based compounds such as bis(2,4,6-trimethylbenzoyl)-phenyl phosphine oxide (Irgacure 819, Ciba Specialty Chemicals Inc.), bis(2,6-dimethoxybenzoyl)-2,4,4-trimethyl-benzylphosphine oxide, or 2,4,6-trimethyl-benzoyl-diphenyl-phosphine oxide (Darocure TPO, Ciba Specialty Chemicals Inc.); and,

(10) Titanocene compounds such as bis($\eta^5$-2,4-cyclopentadien-1-yl)-bis(2,6-difluoro-3-(1H-pyrrol-1-yl)phenyl)titanium (Irgacure 784, Ciba Specialty Chemicals Inc.).

In addition, these compounds may be used alone or two or more types may be mixed together.

These photopolymerization initiators can be used together with a photopolymerization sensitizer. Examples of photopolymerization sensitizers include 4,4'-bis-ethylaminobenzophenone, 1-phenyl-1H-tetrazole-5-thiol and 2,2'-(phenylimino)diethanol. These compounds may be used alone or two or more types may be mixed together. The amount added is preferably 1 to 100 parts by weight and more preferably 1 to 60 parts by weight based on the weight of the photopolymerization initiator.

In the present invention, a compound having two or more polymerizable unsaturated bonding groups can also be added as a crosslinking monomer. A polyfunctional (meth)acrylic compound able to be polymerized by the action of the photopolymerization initiator is preferable for the crosslinking monomer, examples of which include polyethylene glycol diacrylate (number of ethylene glycol units: 2 to 20), polyethylene glycol dimethacrylate (number of ethylene glycol units: 2 to 20), poly(1,2-propylene glycol) diacrylate (number of 1,2-propylene glycol units: 2 to 20), poly(1,2-propylene glycol) dimethacrylate (number of 1,2-propylene glycol units: 2 to 20), polytetramethylene glycol diacrylate (number of tetramethylene glycol units: 2 to 10), polytetramethylene glycol dimethacrylate (number of tetramethylene glycol units: 2 to 10), 1,4-cyclohexane diacrylate, 1,4-cyclohexane methacrylate, pentaerythritol triacrylate, pentaerythritol tetraacrylate, trimethylolpropane triacrylate, ethoxified trimethylolpropane triacrylate (number of ethylene glycol units: 2 to 20), trimethylolpropane trimethacrylate, tri-2-hydroxyethylisocyanurate triacrylate, tri-2-hydroxyethylisocyanurate trimethacrylate, glycerol diacrylate, glycerol dimethacrylate, ditrimethylolpropane triacrylate, ditrimethylolpropane tetraacrylate, dipentaerythritol pentaacrylate, dipentaerythritol hexaacrylate, methylene-bis-acrylamide, ethylene glycol diglycidyl ether-methacrylic acid addition product, glycerol diglycidyl ether-acrylic acid addition product, bisphenol A diglycidyl ether-acrylic acid addition product, bisphenol A diglycidyl ether-methacrylic acid addition product, ethoxified bisphenol A diacrylate (number of ethylene glycol units: 2 to 30), ethoxified bisphenol A dimethacrylate (number of ethylene glycol units: 2 to 30) and N,N'-bis(2-methacryloyloxyethyl)urea. In addition, these compounds may be used alone or two or more types may be mixed together as necessary. The added amount is preferably 1 to 100 parts by weight and more preferably 5 to 50 parts by weight based on the weight of the photosensitive silicone compound of (A).

In the present invention, an adhesion assistant can also be added for the purpose of improving adhesion between the photosensitive silicone compound and the base material. Examples of adhesion assistants that can be used include alkoxysilane compounds such as 3-methacryloxypropyl trimethoxysilane or 3-acryloxypropyl trimethoxysilane. These compounds may be used alone or two or more types may be mixed together. The added amount is preferably 0.1 to 20 parts by weight and more preferably 0.5 to 10 parts by weight based on the weight of the photosensitive silicone compound of (A).

Although the photosensitive resin composition containing the photosensitive silicone compound of (A) and the photopolymerization initiator of (B) can be obtained by reacting the photosensitive silicone compound of (A) with the photopolymerization initiator of (B) in the absence of solvent, in the case of using a solvent, the photosensitive resin composition can be produced by codissolving in propyl acetate. There are no particular limitations on the solvent used at this time provided it dissolves both the photosensitive silicone compound of (A) and the photopolymerization initiator of (B), and specific examples thereof include N,N-dimethylformamide, N-methyl-2-pyrrolidone (NMP), N-ethyl-2-pyrrolidone, tetrahydrofuran, N,N-dimethylacetoamide (DMAc), dimethylsulfoxide, hexamethylphosphorylamide, pyridine, cyclopentanone, γ-butyrolactone (GBL), α-acetyl-γ-butyrolactone, tetramethyl urea, 1,3-dimethyl-2-imidazoline, N-cyclohexyl-2-pyrrolidone, propylene glycol monomethyl ether, propylene glycol monomethyl ether acetate, methyl ethyl ketone, methyl isobutyl ketone, anisole, ethyl acetate, ethyl lactate and butyl lactate, and these can be used alone or two or more types can be used in combination. Although these solvents can be suitably added to the composition of the present invention according to coated film thickness and viscosity, they are preferably used within the range of 5 to 100 parts by weight based on the weight of the silicone compound of (A).

Next, a description is provided of a method for forming a cured relief pattern. The formation of a cured relief pattern is carried out by a method at least comprising a step for obtaining a coated film by coating the aforementioned photosensitive resin composition onto a base material, a step for photocuring an exposed portion by radiating active light onto the coated film, a step for removing an uncured portion of the film using a developing solution, and a step for heating the photocured film, in that order.

Examples of the base material include various base materials as desired, such as a silicon wafer, ceramic substrate, aluminum substrate and other base materials. Examples of methods for coating the photosensitive resin composition onto the base material include coating with a spin coater, bar coater, blade coater, curtain coater or screen printer, as well as spray coating with a spray coater. The thickness of the coated film is preferably 1 to 100 μm and more preferably 2 to 50 μm.

In the case of containing a solvent, the resulting coated film is dried by air-drying, heat drying with an oven or hot plate, or vacuum drying.

The coated film obtained in this manner is then exposed to ultraviolet light in air using an exposure device such as a contact aligner, mirror projection system or stepper after having soft-baked the coated base material at 80 to 200° C. In consideration of pattern resolution and handling ease as a photocured resin, f-rays are preferable for the optical wavelength while a stepper is preferable for the exposure device.

Subsequently, post-exposure baking (PEB) or pre-development baking (pre-baking) may also be carried out using an arbitrary combination of temperature and time (preferably a temperature of 40 to 200° C. for a duration of 10 to 360 seconds) as necessary for the purpose of improving photosensitivity.

Development can be carried out by selecting arbitrarily selecting a method from conventionally known photoresist development methods such as a rotary spray method, paddle method or immersion method in combination with ultrasound treatment.

A combination of a good solvent and a poor solvent with respect to the photosensitive silicone compound of (A) is preferable for the developing solution used. Examples of good solvents include N-methylpyrrolidone, N-acetyl-2-pyrrolidone, N,N'-dimethylacetoamide, cyclopentanone, cyclohexanone, γ-butyrolactone, α-acetyl-γ-butyrolactone and propylene glycol monomethyl ether acetate, while examples of poor solvents include toluene, xylene, methanol, ethanol, isopropyl alcohol, propylene glycol monomethyl ether and water. The ratio of poor solvent to good solvent is adjusted according to the solubility of the photosensitive silicone compound of (A). Each of these solvents can also be used in combination.

Following completion of development, washing is carried out using a rinsing solution to remove the developing solution and allow the obtaining of a coated film with a relief pattern. Distilled water, methanol, ethanol, isopropanol or propylene glycol monomethyl ether and the like can be used alone or after suitably mixing for the rinsing solution, or these can also be used after combining in a stepwise manner.

In the step for heating the base material having the coated film thereon, the base material adhered with the cured relief pattern is heated to 100° C. or higher to carry out heat treatment by causing unreacted styryl groups to bond. The heating temperature is preferably 100 to 300° C. A temperature of 100° C. or higher is preferable from the viewpoint of allowing the reaction of unreacted double bonds to proceed during heating, while a temperature of 300° C. or lower is preferable from the viewpoint of preventing thermal degradation. The heating time is preferably 0.5 to 5 hours. Heating can be carried out with a hot plate, oven or temperature-programmable heating oven. Air may be used for the atmospheric gas during heating, or an inert gas such as nitrogen or argon can be used.

Various types of semiconductor devices can be produced by selecting the cured relief pattern from a group consisting of a surface protective film, interlayer insulating film and α-ray shielding film for the semiconductor devices formed on a base material such as a silicon wafer, and applying a commonly semiconductor device production method for the other steps.

EXAMPLES

The following provides a more detailed explanation of the present invention through examples thereof.

Example 1

Synthesis of Photosensitive Silicone Compound 0.5 moles (108.16 g) of diphenyl silanediol, 0.5 moles (112.15 g) of styryl trimethoxysilane, and 0.011 moles (3.13 g) of titanium tetraisopropoxide were charged into a 500 ml round-bottom flask, followed by attaching a condenser to the flask and gradually raising the temperature of the mixture from room temperature to 80° C. in an oil bath. After the temperature of the oil bath reached 80° C. and refluxing was confirmed by the presence of methanol formed, refluxing was allowed to continue for 1 hour at the same temperature. The condenser was removed from the round-bottom flask and the methanol was removed by drawing a vacuum at the same temperature. At this time, the degree of vacuum was increased gradually so that boiling did not occur, and once the vacuum reached about 1 to 3 torr, a vacuum was continued to be drawn while stirring at 80° C. Finally, the pressure was returned to normal pressure and removal of methanol was completed to synthesize a photosensitive silicone compound.

<Preparation and Evaluation of Photosensitive Resin Composition>

1 part by weight of a photopolymerization initiator in the form of Darocure TPO manufactured by Ciba Specialty Chemicals Inc. (2,4,6-trimethylbenzoyldiphenyl phosphine oxide) was dissolved in 100 parts by weight of the synthesized photosensitive silicone compound while stirring to prepare a photosensitive resin composition (to also be referred to as a "varnish").

This varnish was spin-coated onto a silicon wafer using a spin coater followed by pre-baking for 6 minutes at 120° C. Continuing, the entire resin surface was exposed in an air atmosphere using an i-ray exposer (Canon Inc., PLA Exposer) (exposure: 500 mJ/cm$^2$). When this was spin-developed using propylene glycol monomethyl ether acetate (PGMEA) for the developing solution, the residual film rate as determined from the difference in film thickness before and after development was 70%. Although this developed film was finished being cured by heat-treating for 3 hours at 180° C. in an $N_2$ atmosphere, film thickness loss was not observed during the course of this heat treatment.

Example 2

A photosensitive silicone compound was synthesized and a photosensitive resin composition was prepared and evaluated in the same manner as Example 1 with the exception using 0.001 moles of barium hydroxide for the solvent instead of 0.011 moles of titanium tetraisopropoxide. At this time, the residual film rate following exposure and development was 70%. Although this developed film was finished being cured by heat-treating for 3 hours at 180° C. in an $N_2$ atmosphere, film thickness loss was not observed during the course of this heat treatment.

Example 3

A photosensitive silicone compound was synthesized and a photosensitive resin composition was prepared and evaluated in the same manner as Example 1 with the exception using CGI 403 manufactured by Ciba Specialty Chemicals Inc. (bis(2,6-dimethoxybenzoyl)-2,4,4-trimethylpentyl phosphine oxide) for the photopolymerization initiator instead of Darocure TPO. At this time, the residual film rate following exposure and development was 50%. Although this developed film was finished being cured by heat-treating for 3 hours at 180° C. in an $N_2$ atmosphere, film thickness loss was not observed during the course of this heat treatment.

Example 4

A photosensitive silicone compound was synthesized and a photosensitive resin composition was prepared and evaluated in the same manner as Example 1 with the exception of using Irgacure 819 manufactured by Ciba Specialty Chemicals Inc. (bis(2,4,6-trimethylbenzoyl)phenyl phosphine oxide) for the photopolymerization initiator instead of Darocure TPO. At this time, the residual film rate following exposure and development was 40%. Although this developed film was finished being cured by heat-treating for 3 hours at 180° C. in an $N_2$ atmosphere, film thickness loss was not observed during the course of this heat treatment.

Example 5

A photosensitive resin composition was prepared and evaluated in the same manner as Example 1 with the exception of using RF11 purchased from Fraunhofer ISC of Germany (photosensitive silicone compound obtained by condensing diisobutyl silanediol and styryl methyl diethoxide using a catalyst without aggressively adding water) for the photosensitive silicone compound instead of that synthesized in Example 1. At this time, the residual film rate following exposure and development was 60%. Although this developed film was finished being cured by heat-treating for 3 hours at 180° C. in an $N_2$ atmosphere, film thickness loss was not observed during the course of this heat treatment.

Comparative Example 1

A photosensitive silicone compound was synthesized and a photosensitive resin composition was prepared and evaluated in the same manner as Example 1 with the exception of using Irgacure 369 manufactured by Ciba Specialty Chemicals Inc. (2-benzyl-2-dimethylamino-1-(4-morpholinophenyl)-butanone-1) for the photopolymerization initiator instead of Darocure TPO. At this time, the residual film rate following exposure and development was 0%.

Comparative Example 2

A photosensitive silicone compound was synthesized and a photosensitive resin composition was prepared and evaluated in the same manner as Example 1 with the exception of using Irgacure 127 manufactured by Ciba Specialty Chemicals Inc. (2-hydroxy-1-{4-[4-(2-hydroxy-2-methylpropionyl)-benzyl]-phenyl}-2-methylpropan-1-one) for the photopolymerization initiator instead of Darocure TPO. At this time, the residual film rate following exposure and development was 0%.

Comparative Example 3

A photosensitive silicone compound was synthesized and a photosensitive resin composition was prepared and evaluated in the same manner as Example 1 with the exception of using Irgacure OXE02 manufactured by Ciba Specialty Chemicals Inc. (1-[9-ethyl-6-(2-methylbenzoyl)-9H-carbazol-3-yl]-1-(O-acetyloxime)) for the photopolymerization initiator instead of Darocure TPO. At this time, the residual film rate following exposure and development was 0%.

Comparative Example 4

A photosensitive resin composition was prepared and evaluated in the same manner as Example 5 with the exception of using Irgacure 369 manufactured by Ciba Specialty Chemicals Inc. (2-benzyl-2-dimethylamino-1-(4-morpholinophenyl)-butanone-1) for the photopolymerization initiator instead of Darocure TPO. At this time, the residual film rate following exposure and development was 0%.

The results for Examples 1 to 5 and Comparative Examples 1 to 4 are summarized in Table 1.

TABLE 1

|  | Ex. 1 | Ex. 2 | Ex. 3 | Ex. 4 | Ex. 5 | Comp. Ex. 1 | Comp. Ex. 2 | Comp. Ex. 3 | Comp. Ex. 4 |
|---|---|---|---|---|---|---|---|---|---|
| Photosensitive silicone*1 | 100 |  | 100 | 100 |  | 100 | 100 | 100 |  |
| Photosensitive silicone*2 |  | 100 |  |  |  |  |  |  |  |
| RF11 |  |  |  |  | 100 |  |  |  | 100 |
| Darocure TPO | 1 | 1 |  |  | 1 |  |  |  |  |
| CGI 403 |  |  | 1 |  |  |  |  |  |  |
| Irgacure 819 |  |  |  | 1 |  |  |  |  |  |
| Irgacure 369 |  |  |  |  |  | 1 |  |  | 1 |
| Irgacure 127 |  |  |  |  |  |  | 1 |  |  |
| Irgacure OXE02 |  |  |  |  |  |  |  | 1 |  |
| Residual film rate (%) | 70 | 70 | 50 | 40 | 60 | 0 | 0 | 0 | 0 |

*1Diphenyl silanediol, styryl trimethoxysilane condensate, titanium isopropoxide catalyst
*2Diphenyl silanediol, styryl trimethoxysilane condensate, barium hydroxide catalyst

INDUSTRIAL APPLICABILITY

The present invention can be preferably used in the field of photosensitive insulating films used electronic materials such as semiconductor devices or multilayer wiring boards.

The invention claimed is:

1. A photosensitive resin composition, comprising:
(A) 100 parts by weight of a photosensitive silicon compound described in (I) below, and (B) 0.1 to 20 parts by weight of a photopolymerization initiator described in (II) below:
  (I) the photosensitive silicon compound is obtained by adding to at least one type of silanol compound represented by the following formula (a) (to be referred to as component (a)), a component (b) in the form of at least one type of compound selected from the group consisting of compounds represented by the following general formulas (b1), (b2), (b3) and (b4) (to be referred to as components (b1), (b2), (b3) and (b4)) containing the component (b1) at 10 to 100% in terms of the number of moles thereof, at a ratio of component (a) to component (b) of 40/60 mol % to 60/40 mol %, followed by condensing using a catalyst without adding water;
  wherein, the number of moles of component (b)=(number of moles of component (b1)+the number of moles of component (b2))+(3/2×number of moles of component (b3))+(2×number of moles of component (b4));

$$R^1{}_2Si(OH)_2 \qquad (a)$$

(wherein, $R^1$ represents at least one type of group selected from the group consisting of a $C_1$-$C_{12}$ linear alkyl group, $C_3$-$C_{12}$ branched alkyl group, $C_3$-$C_{12}$ cyclic alkyl group, $C_6$-$C_{12}$ aryl group, $C_7$-$C_{12}$ alkylaryl group and $C_7$-$C_{12}$ arylalkyl group, and $R^1$ may be the same or different);

$$R^2{}_a R^3{}_b SiX_{4-a-b} \qquad (b1)$$

(wherein, $R^2$ represents a substituent represented by the following formula (1) or (2), $R^3$ represents a $C_1$-$C_{12}$ hydrocarbon group, X represents a $C_1$-$C_{12}$ alkoxy group, a represents an integer selected from 1 and 2, b represents an integer selected from 0 and 1, a+b does not exceed 2, and in the case a is 2, $R^2$ may be the same or different);

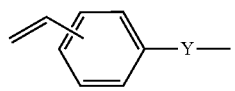

(1)

(wherein, Y represents a $C_1$-$C_{12}$ hydrocarbon group or a $C_1$-$C_{12}$ hydrocarbon group containing one or more types of elements selected from the group consisting of oxygen, nitrogen, fluorine and sulfur);

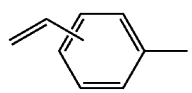

(2)

$$R^4{}_a R^3{}_b SiX_{4-a-b} \qquad (b2)$$

(wherein, $R^4$ represents one type of group selected from the group consisting of a linear $C_1$-$C_{12}$ alkyl group, $C_3$-$C_{12}$ branched alkyl group, $C_3$-$C_{12}$ cyclic alkyl group, $C_6$-$C_{12}$ aryl group, $C_7$-$C_{12}$ alkylaryl group, $C_7$-$C_{12}$ arylalkyl group, $C_2$-$C_7$ epoxy group or unsaturated double bond-containing hydrocarbon group, $C_1$-$C_{12}$ amino group-, ureido group- or mercapto group-containing hydrocarbon group, and $C_1$-$C_{12}$ fluorine-containing hydrocarbon group, $R^3$ represents a $C_1$-$C_{12}$ hydrocarbon group, X represents a $C_1$-$C_{12}$ alkoxy group, a represents an integer selected from 1 and 2, b represents an integer selected from 0 and 1, a+b does not exceed 2, and in the case a is 2, $R^4$ may be the same or different);

$$M^1 X_3 \qquad (b3)$$

(wherein, $M^1$ represents boron or aluminum, and X represents a $C_1$-$C_{12}$ alkoxy group);

$$M^2 X_4 \qquad (b4)$$

(wherein, $M^2$ represents silicon, germanium, titanium or zirconium, and X represents a $C_1$-$C_{12}$ alkoxy group); and,
  (II) at least one type of photopolymerization initiator having a phosphine oxide group represented by the following formula (e):

(e)

(wherein, m represents an integer selected from 1 and 2, $R^5$ and $R^6$ respectively and independently represent one type of group selected from the group consisting of a $C_1$-$C_{12}$ alkyl group, $C_6$-$C_{12}$ aryl group, $C_7$-$C_{12}$ alkylaryl group and $C_1$-$C_3$ alkoxy or halogen-substituted aryl group, and in the case of a plurality of $R^5$ and $R^6$, $R^5$ and $R^6$ may be the same or different).

2. The photosensitive resin composition according to claim 1, wherein the catalyst used to obtain the photosensitive silicon compound of (A) is one or more types selected from the group consisting of an acidic compound, a basic compound and a fluoride.

3. A method for forming a cured relief pattern comprising: a step for obtaining a coated film by coating the photosensitive resin composition according to claim 1 or 2 onto a base material, a step for photocuring an exposed portion by radiating active light onto the coated film, a step for removing an uncured portion of the film using a developing solution, and a step for heating the photocured film, in that order.

4. A cured relief pattern obtained according to the method according to claim 3.

5. A semiconductor device containing the cured relief pattern according to claim 4.

* * * * *